(12) United States Patent
Lee et al.

(10) Patent No.: US 6,215,142 B1
(45) Date of Patent: Apr. 10, 2001

(54) ANALOG SEMICONDUCTOR DEVICE AND METHOD OF FABRICATING THE SAME

(75) Inventors: Jae Dong Lee; Myung Hwan Cha, both of Pusan (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

(21) Appl. No.: 09/217,342

(22) Filed: Dec. 21, 1998

(30) Foreign Application Priority Data

Dec. 29, 1997 (KR) .................................................. 97-76732

(51) Int. Cl.$^7$ ...................................................... H01L 29/72
(52) U.S. Cl. .......................... 257/301; 257/311; 257/513; 257/516; 257/532; 438/210; 438/228; 438/239; 438/252; 438/394; 438/439
(58) Field of Search .................................... 257/301, 311, 257/513, 516, 532; 438/210, 228, 239, 252, 394, 439

(56) References Cited

U.S. PATENT DOCUMENTS

| | | | |
|---|---|---|---|
| 4,912,055 | 3/1990 | Min et al. | 437/31 |
| 4,970,174 | 11/1990 | Min et al. | 437/51 |
| 5,053,350 | 10/1991 | Solomon | 437/47 |
| 5,187,566 | * 2/1993 | Yoshikawa et al. | 257/301 |
| 5,281,835 | 1/1994 | Tomita et al. | 257/204 |
| 5,378,919 | 1/1995 | Ochiai | 257/204 |
| 5,397,729 | 3/1995 | Kayanuma et al. | 437/52 |
| 5,670,410 | 9/1997 | Pan | 437/60 |
| 5,723,375 | 3/1998 | Ma et al. | 438/258 |
| 5,780,333 | 7/1998 | Kim | 438/238 |

FOREIGN PATENT DOCUMENTS

| | | | |
|---|---|---|---|
| 05095263 | 4/1993 | (JP) | H03K/17/00 |
| 06252345 | 9/1994 | (JP) | H01L/27/04 |
| 06318673 | 11/1994 | (JP) | H01L/27/04 |

\* cited by examiner

*Primary Examiner*—Edward Wojciechowicz
(74) *Attorney, Agent, or Firm*—Ladas & Parry

(57) ABSTRACT

An analog semiconductor device capable of preventing open of interconnection lines and notching due to step between transistor and capacitor regions is disclosed.

An analog semiconductor device according to the present invention, includes a semiconductor substrate; a first, a second, and a third isolating layer of trench type formed on the substrate and defining a transistor region and a capacitor region, respectively; a lower electrode of a capacitor formed in the surface of the substrate of the capacitor region; an oxide layer formed under the lower electrode and insulating the lower electrode and the substrate; an gate insulating layer formed on the substrate of the transistor region; an dielectric layer formed on the lower electrode; a gate formed on the gate insulating layer; an upper electrode of the capacitor formed on the dielectric layer.

10 Claims, 3 Drawing Sheets

ANALOG SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly to an analog semiconductor device capable of preventing step between transistor and capacitor regions and a method of fabricating the same.

2. Description of the Related Art

In general, an analog semiconductor device stores information in various states, while a digital semiconductor device stores information in only two states, LOW and HIGH. The analog semiconductor device includes a resistor and capacitor at each node of its circuit. Since the resistance and capacitance vary with voltage, a resistor having a specific value is required.

FIG. 1 shows a cross-sectional view for describing a method of fabricating a conventional analog semiconductor device. Referring to FIG. 1, field oxide layers 2 are formed on a semiconductor substrate 1 by a well-known LOCOS (LOCal Oxidation of Silicon), to define a transistor region A and an analog capacitor region B. A gate insulating layer 3, a first doped polysilicon layer 4, a tungsten silicide layer 5 are then deposited on the overall substrate 21 in sequence and patterned, so that a gate 100a is formed on the substrate 21 of the transistor region A and a lower electrode 100b of a capacitor is formed on the field oxide layer 2 of the analog capacitor region B. On the lower electrode 100b, are then formed a polysilicon layer for buffer 6 and an oxide layer 7 acting as a dielectric layer. In case bonds between fluorine(F) gas of the tungsten silicide layer 5 and $O_2$ gas are formed, the polysilicon layer for buffer 6 prevents capacitance decrease due to thickness variation of the oxide layer 7. Thereafter, an upper electrode 8 of the capacitor is formed on the oxide layer 7, thereby forming an analog capacitor 200. Here, the upper electrode 8 is formed to a second doped polysilicon layer. When patterning the gate 100a and the upper electrode 8, ARC layers 9 are formed on the tungsten silicide layer 5 and the second doped polysilicon layer, respectively.

However, as described above, since the analog capacitor 200 is formed on the field oxide layer 2, a step occurs between the transistor region A and capacitor region B. Owing to this step, the metal interconnection lines are opened when forming them and notching occurs when performing photolithography, thereby deteriorating reliability and yield of the device. Furthermore, these problems occur especially in devices under submicron.

SUMMARY OF THE INVENTION

It is therefore one object of the present invention to provide an analog semiconductor device capable of preventing open of interconnection lines and notching due to step between transistor and capacitor regions.

Furthermore, it is another object of the present invention to provide a method of fabricating the analog semiconductor device capable of preventing step between transistor and capacitor region.

To accomplish one object of the present invention, an analog semiconductor device according to the present invention, includes : a semiconductor substrate; a first, a second, and a third isolating layer of trench type formed on the substrate and defining a transistor region and a capacitor region, respectively; a lower electrode of a capacitor formed in the surface of the substrate of the capacitor region; an oxide layer formed under the lower electrode and insulating the lower electrode and the substrate; a gate insulating layer formed on the substrate of the transistor region; an dielectric layer formed on the lower electrode; a gate formed on the gate insulating layer; an upper electrode of the capacitor formed on the dielectric layer.

Furthermore, to accomplish another object of the present invention, an analog semiconductor device according to the present invention, is fabricated as follows. Firstly, a mask pattern for a low electrode of a capacitor is formed to expose a portion of the substrate. An oxide ion-implantation layer is then formed in the substrate by ion-implanting oxide ions at a first energy. Thereafter, an impurity ion-implantation layer of a high concentration is formed over the oxide ion-implantation layer by ion-implanting impurity ions of the high concentration at a second energy being lower than the first energy. The mask pattern is removed and the substrate of a resultant structure is annealed, to form an oxide layer in the substrate and form a lower electrode of a capacitor on the oxide layer, the lower electrode being made of a diffusion layer of the high concentration. Thereafter, isolating layers of trench-type are formed in the substrate to define a transistor region and a capacitor region, respectively, the capacitor region having the oxide layer and the lower electrode. An insulating layer and a conductive layer for a gate are formed on the overall substrate, sequentially and patterned to form a gate insulating layer and gate on the substrate of the transistor region and simultaneously form a dielectric layer and an upper electrode of the capacitor on the lower electrode of the capacitor region.

In an embodiment of the present invention, annealing is performed to temperature of 900 to 1,100° C.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to the accompanying drawings.

FIG. 2A through FIG. 2D show cross sectional views for describing a method of fabricating according to an embodiment of the present invention.

Figure 1:
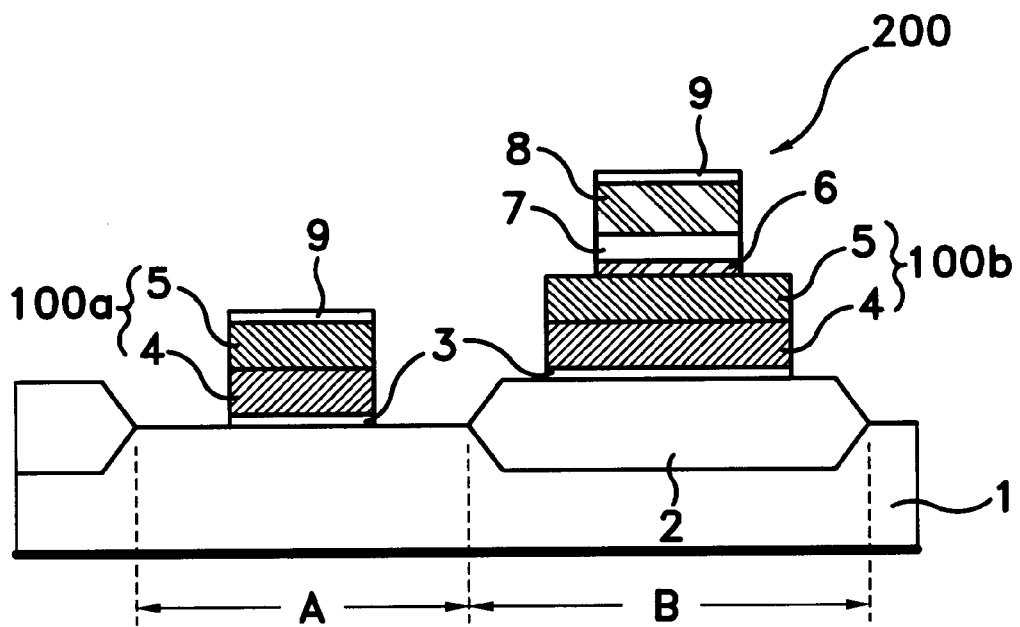
FIG. 1 shows a cross sectional view for describing a method of fabricating a conventional analog semiconductor device
Figure 2A:
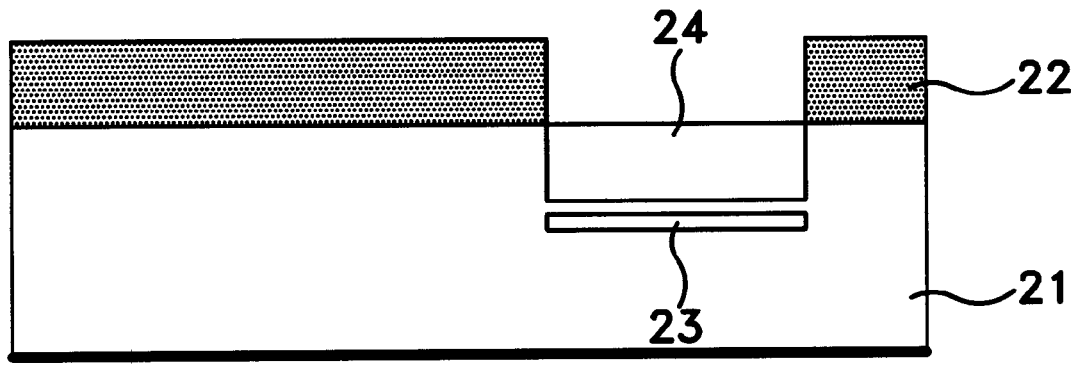
FIG. 2A through FIG. 2D show cross sectional views for describing a method of fabricating an analog semiconductor device according to an embodiment of the present invention.

Referring to FIG. 2A, a mask pattern 22 for a lower electrode of a capacitor is formed on a semiconductor substrate 21 of a P-type silicon by a photolithography, to expose a portion of the substrate 21. Oxide ions are implanted into the exposed portions of the substrate 21 by a first ion-implantation at a first energy, to form an oxide ion-implantation layer 23 in the substrate 21. The first ion-implantation is performed to two or three times such that the oxide ion-implantation layer 23 has a graded doping profile. Subsequently, N type impurity ions of a high concentration are implanted into the exposed portions of the substrate 21 by a second ion-implantation at a second energy being lower than the first energy, to form a N type impurity ion layer 24 of a high concentration to the surface of the substrate 21 over the oxide ion-implantation layer 23.

Figure 2B:
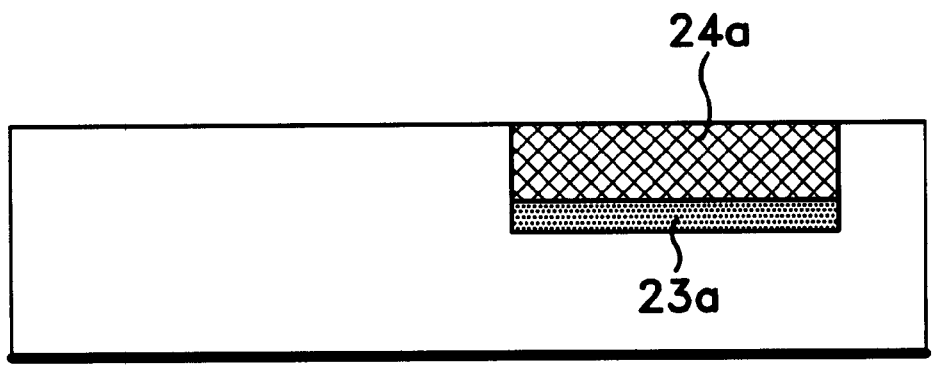
Figure 2C:
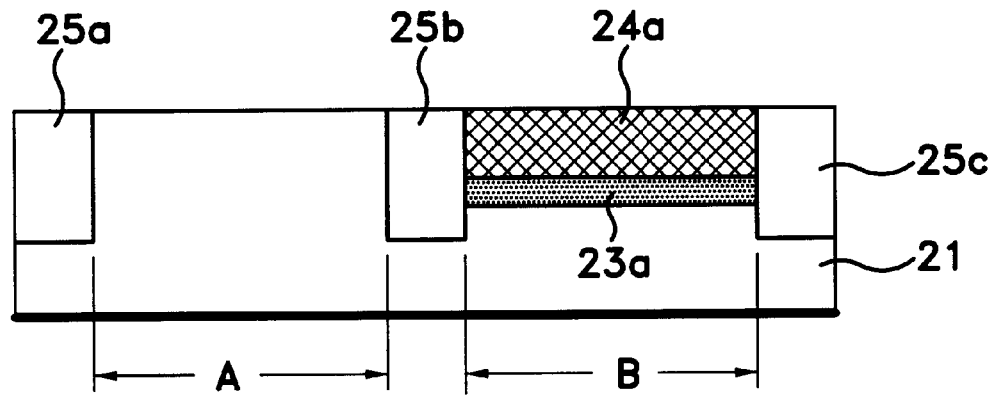

Referring to FIG. 2B, the mask pattern 22 (refer to FIG. 2A) is removed and then annealing is performed to temperature of 900 to 1,100° C. Therefore, the oxide ions of the oxide ion-implantation layer 24 react with silicon ions, to form an oxide layer 23a. Simultaneously, impurity ions of the N type impurity ion layer 24 of the high concentration are activated, to form a lower electrode 24 of a capacitor made of a N type impurity diffusion layer of a high concentration. As shown in FIG. 2B, the lower electrode 24a and the substrate 21 are insulated to each other by the oxide layer 23a, so that parasitic current due to junction capacitor is prevented. Thereafter, isolating layers 25a, 25b, and 25c are formed in the substrate by a trench-isolation technique, to define a transistor region A and an analog capacitor region B, as shown in FIG. 2C. Here, the transistor region A and the analog capacitor region B are isolated from each other by the isolating layer 25b.

Figure 2D:
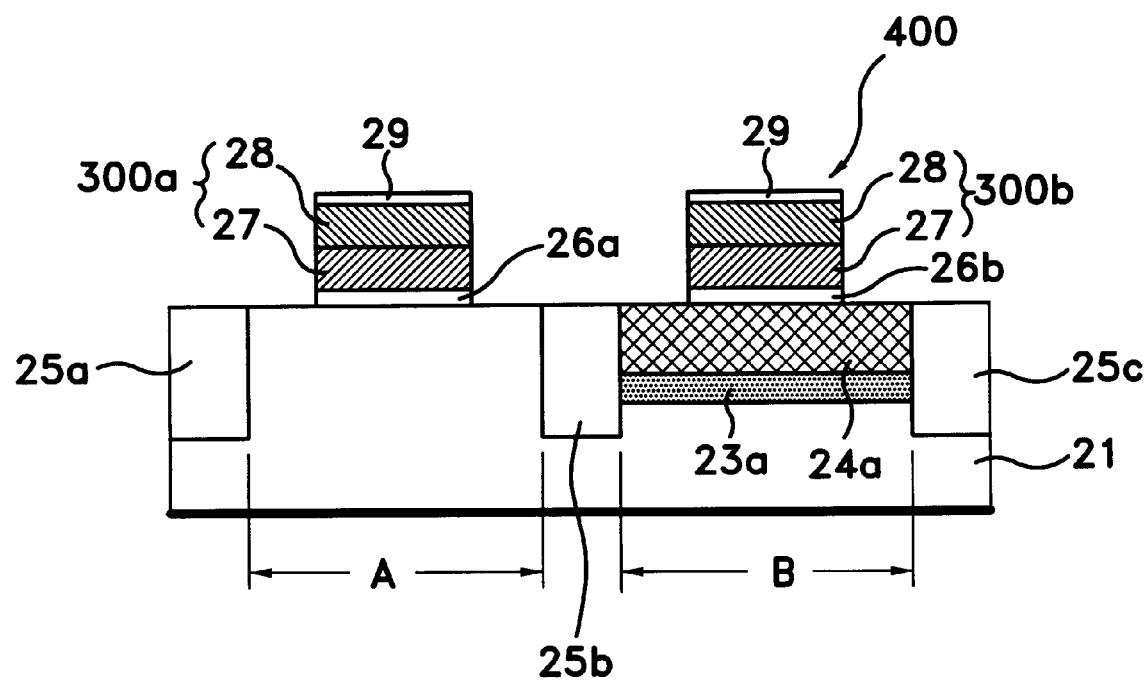

Referring to FIG. 2D, an insulating layer, a doped polysilicon layer 27, a tungsten silicide layer 28, and an ARC layer 29 are sequentially formed on the structure of FIG. 2C and patterned, to form a gate insulating layer 26a and a gate 300a on the substrate 21 of the transistor region A. Simultaneously, a dielectric layer 26b and an upper electrode 300b of the capacitor are formed on the lower electrode 24a of the capacitor region B, to form an analog capacitor 400. On the other hand, as not shown in FIG. 2D, double insulating layers may be selectively formed on the capacitor region A, for the purpose of forming the dielectric layer 26a having a thicker thickness than the gate insulating layer 26a.

According to the present invention described above, the lower electrode of the analog capacitor is formed in the substrate and the upper electrode thereof and the gate are formed on the same plane, so that step is not formed between the capacitor and transistor regions. Therefore, opening of the interconnection lines and notching are prevented, thereby improving reliability and yield of device.

Furthermore, the gate insulating layer and the dielectric layer are simultaneously formed, to simplify the process. Moreover, the gate of the transistor and the upper electrode of the capacitor are simultaneously formed, to improve characteristics of the transistor.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:
1. An analog semiconductor device, comprising:
    a semiconductor substrate;
    a first, a second, and a third isolating layer of trench type formed on the substrate and defining a transistor region and a capacitor region, respectively;
    a lower electrode of a capacitor formed in the surface of the substrate of the capacitor region;
    an oxide layer formed under the lower electrode and insulating the lower electrode and the substrate;
    a gate insulating layer formed on the substrate of the transistor region;
    a dielectric layer formed on the lower electrode;
    a gate formed on the gate insulating layer;
    an upper electrode of the capacitor formed on the dielectric layer.
2. The analog semiconductor device according to claim 1, wherein the lower electrode is made of an impurity diffusion layer of the high concentration.
3. The analog semiconductor device according to claim 2, wherein the impurity diffusion layer is N type.
4. The analog semiconductor device according to claim 1, wherein the substrate is p type.
5. A method of fabricating an analog semiconductor device, comprising the steps of:
    forming a mask pattern for a low electrode of a capacitor to expose a portion of the substrate;
    forming an oxide ion-implantation layer in the substrate by ion-implanting oxide ions at a first energy;
    forming an impurity ion-implantation layer of a high concentration over the oxide ion-implantation layer by ion-implanting impurity ions of the high concentration at a second energy being lower than the first energy;
    removing the mask pattern;
    annealing the substrate of a resultant structure, to form an oxide layer in the substrate and form a lower electrode of a capacitor on the oxide layer, the lower electrode being made of a diffusion layer of the high concentration;
    forming isolating layers of trench-type in the substrate to define a transistor region and a capacitor region, respectively, the capacitor region having the oxide layer and the lower electrode;
    forming an insulating layer and a conductive layer for gate on the overall substrate, sequentially; and
    patterning the conductive layer for gate and the insulating layer to form a gate insulating layer and gate on the substrate of the transistor region and simultaneously form a dielectric layer and an upper electrode of the capacitor on the lower electrode of the capacitor region.
6. The method of fabricating the analog semiconductor device according to claim 5, wherein the step of annealing is performed to temperature of 900 to 1,100° C.
7. The method of fabricating the analog semiconductor device according to claim 5, wherein the conductive layer for the gate is made of a double layer of a doped polysilicon layer and a tungsten silicide layer.
8. The method of fabricating the analog semiconductor device according to claim 5, wherein an ARC layer is further formed on the conductive layer for the gate.
9. The method of fabricating the analog semiconductor device according to claim 5, wherein the substrate is p type.
10. The method of fabricating the analog semiconductor device according to claim 5, wherein the impurity ion is N type.

* * * * *